(12) United States Patent
Chen et al.

(10) Patent No.: US 7,553,611 B2
(45) Date of Patent: Jun. 30, 2009

(54) MASKING OF REPEATED OVERLAY AND ALIGNMENT MARKS TO ALLOW REUSE OF PHOTOMASKS IN A VERTICAL STRUCTURE

(75) Inventors: Yung-Tin Chen, Santa Clara, CA (US); Christopher J Petti, Mountain View, CA (US); Steven J Radigan, Fremont, CA (US); Tanmay Kumar, Pleasanton, CA (US)

(73) Assignee: Sandisk 3D LLC, Milpitas, CA (US)

( * ) Notice: Subject to any disclaimer, the term of this patent is extended or adjusted under 35 U.S.C. 154(b) by 682 days.

(21) Appl. No.: 11/097,496

(22) Filed: Mar. 31, 2005

(65) Prior Publication Data

US 2006/0222962 A1    Oct. 5, 2006

(51) Int. Cl.
*G03C 5/00* (2006.01)
*G03C 1/00* (2006.01)
(52) U.S. Cl. .......................... 430/394; 430/5
(58) Field of Classification Search ............ 430/5, 430/394; 438/394, 622, 692, 740
See application file for complete search history.

(56) References Cited

U.S. PATENT DOCUMENTS

| 5,728,618 | A | 3/1998 | Tseng |
| 6,020,263 | A | 2/2000 | Shih et al. |
| 6,133,641 | A | 10/2000 | Hamada |
| 6,500,750 | B1 | 12/2002 | Shroff et al. |
| 6,535,274 | B2 | 3/2003 | Antoni |
| 2002/0036357 | A1 | 3/2002 | Sugiyama |
| 2005/0196951 | A1* | 9/2005 | Lin et al. .................... 438/622 |

FOREIGN PATENT DOCUMENTS

| JP | 63313866 | 12/1988 |
| JP | 09232207 | 9/1997 |

OTHER PUBLICATIONS

Office Action for Taiwan Application No. 095111700 issued Oct. 25, 2007.
International Search Report for International Application No. PCT/US2006/011715 mailed Aug. 25, 2006.
Written Opinion for International Application No. PCT/US2006/011715 mailed Aug. 25, 2006.
International Preliminary Report on Patentability for International Application No. PCT/US2006/011715 issued Oct. 3, 2007.

\* cited by examiner

*Primary Examiner*—Stephen Rosasco
(74) *Attorney, Agent, or Firm*—Dugan & Dugan, PC

(57) ABSTRACT

In formation of monolithic three dimensional memory arrays, a photomask may be used more than once. Reuse of a photomask creates second, third or more instances of reference marks used by the stepper to achieve alignment (alignment marks) and to measure alignment achieved (overlay marks) directly above prior instances of the same reference mark. The prior instances of the same reference mark may cause interference with the present instance of the reference mark, complicating alignment and measurement. Using the methods of the present invention, blocking structure is created vertically interposed between subsequent instances of the same reference mark, preventing interference.

24 Claims, 10 Drawing Sheets

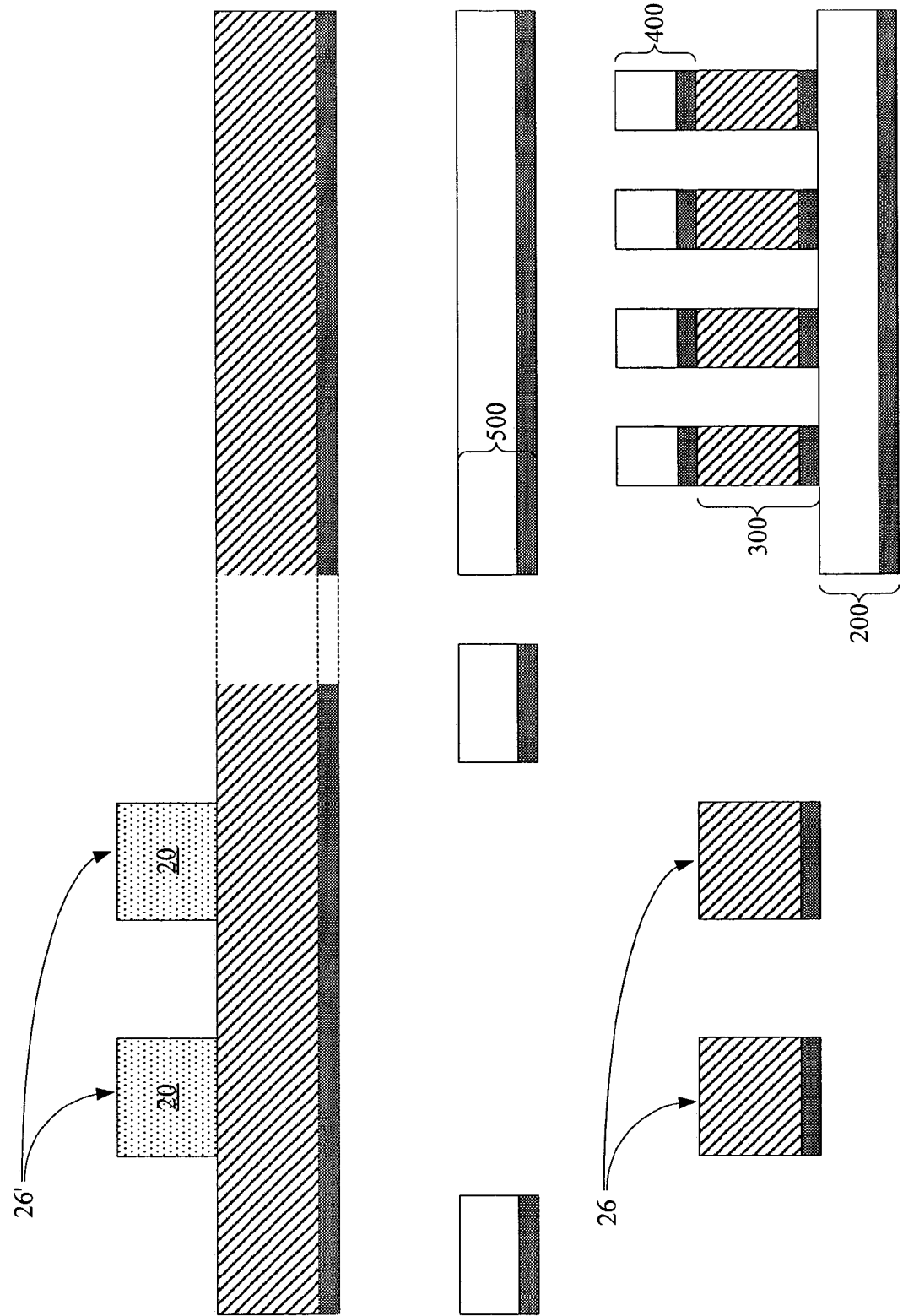

MASKING OF REPEATED OVERLAY AND ALIGNMENT MARKS TO ALLOW REUSE OF PHOTOMASKS IN A VERTICAL STRUCTURE

BACKGROUND OF THE INVENTION

The invention relates to a method to avoid interference between recurring alignment and overlay marks formed when a photomask is reused at different vertical heights in fabrication of an integrated circuit.

In conventional integrated circuit design, it is not usual to reuse a photomask. In some complex structures, however, it may be most cost-effective to use the same photomask more than once. When a photomask is reused, the reference marks (alignment and overlay marks) used to align the following photomask and to check the alignment achieved are reproduced in almost exactly the same location as in the first use of the mask. The prior reference marks can interfere with the present reference marks.

There is a need, therefore, for a way to reuse photomasks while preventing interference between recurring reference marks.

SUMMARY OF THE PREFERRED ASPECTS AND EMBODIMENTS

The present invention is defined by the following claims, and nothing in this section should be taken as a limitation on those claims. In general, the invention is directed to a method to allow reuse of a photomask in fabrication of a complex structure on a single wafer without undesirable interference between repeated instances of the same reference mark created at different levels.

A first aspect of the invention provides for a method to allow reuse of a first photomask in a monolithically formed stacked vertical structure, the method comprising: using the first photomask to form a first reference mark in a first layer; forming a blocking structure above the first reference mark, wherein the blocking structure serves to obscure the first reference mark when viewed from above; using the first photomask to form a second reference mark in a second layer, the second layer above the first layer and above the blocking structure.

Another aspect of the invention provides for a monolithic three dimensional semiconductor device structure comprising: a first layer including a first occurrence of a first reference mark at a first location; a second layer including a second occurrence of the first reference mark at a second location, wherein the second location is substantially directly above the first location; and an intermediate layer between the first layer and the second layer, the intermediate layer including a blocking structure, wherein the blocking structure is vertically interposed between the first occurrence of the first reference mark and the second occurrence of the first reference mark.

A preferred embodiment of the invention provides for a method for avoiding interference between recurring reference marks when reusing photomasks in formation of a vertically stacked structure, the method comprising: using a first photomask to form a first reference mark at a first height above a substrate and at a first position; forming a blocking structure at a second height above the first height and at a second position, the second position substantially directly above the first position; using the first photomask to form a second reference mark at a third height above the second height and at a third position, the third position substantially directly above the second position, wherein, during the step of forming the second reference mark, the blocking structure serves to substantially render the first reference mark substantially undetectable when viewed from above.

Another preferred embodiment of the invention provides for a monolithic three dimensional memory array comprising a) a first memory level, the first memory level comprising a first layer at a first height, the first layer including a first occurrence of a first reference mark; b) a second memory level, the second memory level comprising a second layer at a second height above the first height, the second layer including a second occurrence of the first reference mark, the second occurrence of the first reference mark formed substantially directly above the first reference mark; and c) an intervening layer at a third height between the second height and the first height, the intervening layer including a blocking structure, the blocking structure vertically interposed between the first occurrence of the first reference mark and the second occurrence of the first reference mark, wherein the second memory level is monolithically formed above the first memory level.

A related embodiment provides for a method for forming a monolithic three dimensional memory array, the method comprising: a) forming a first memory level, the step of forming the first memory level comprising using a first photomask to form a first layer at a first height, the first layer comprising a first reference mark; b) forming a second layer at a second height above the first height, the second layer comprising a blocking structure; and c) forming a second memory level, the step of forming the second memory level comprising using the first photomask to form a third layer at a third height above the second height, the third layer comprising a second reference mark, wherein the blocking structure is vertically interposed between the first reference mark and the second reference mark.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIG. 10a is a cross-sectional view showing interference between two instances of the same inner overlay mark formed at different levels.

DETAILED DESCRIPTION OF THE PREFERRED EMBODIMENTS

During fabrication of an integrated circuit, patterned features are conventionally formed using photolithography and etch techniques. To pattern using photolithography, a photomask, which transmits light in some areas and blocks it in others, is formed, the blocking areas corresponding to the pattern (or its inverse) to be formed on the wafer surface. The surface to be patterned, for example a semiconductor, conductive, or dielectric layer, is covered with a layer of photoresist, a photoreactive material. Light is projected onto the photoresist surface using the photomask, selectively exposing areas of photoresist. The wafer is then subjected to a developing process, in which exposed photoresist (or unexposed photoresist, in the case of negative photoresist) is removed, leaving patterned photoresist behind.

The remaining patterned photoresist then typically serves to protect underlying material during a subsequent etch process, creating features in the same pattern as the remaining photoresist.

Formation of a typical integrated circuit will include the use of multiple photomasks, each defining a pattern, each of which must be aligned to the wafer with considerable precision. In some cases, each successive photomask is aligned to a single reference mark on the wafer. In other cases, however, over time this initial reference mark becomes obscured or otherwise undetectable. In this case, each layer can be aligned to a previous patterned layer, ideally the layer formed immediately before it. This form of alignment is called layer-to-layer alignment.

Reference marks used to accomplish and confirm alignment of a photomask come in two types: alignment marks and overlay marks.

Figure 1:
FIG. 1 is a plan view of a typical alignment mark.

The actual shapes of alignment mark and overlay marks vary according to the manufacturer. FIG. 1 shows a typical alignment mark. Elements of the photolithography alignment system, such as the stepper, for example, look for this alignment mark formed in a previous layer and places the photomask in relation to it.

Figure 2A:
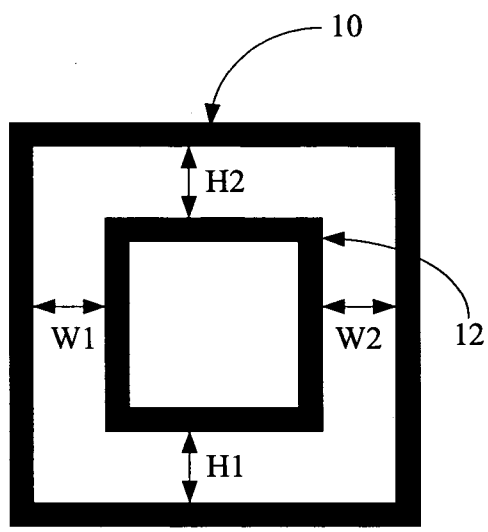
FIG. 2a is a plan view of a measured overlay mark and an target overlay mark with perfect alignment.
Figure 2B:
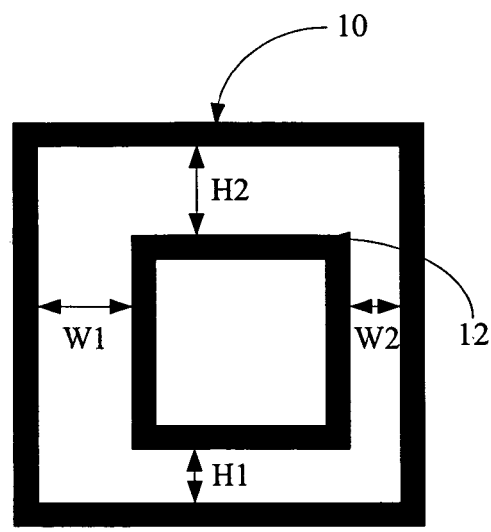
FIG. 2b is a plan view of a measured overlay mark and an target overlay mark with imperfect alignment.

After a photomask has been used to expose photoresist and the photoresist has been developed, creating patterned features in the photoresist, a measurement is taken to determine how well the photomask was actually aligned to the reference layer. This measurement is done using overlay marks, which are typically formed in pairs. A target overlay mark is formed in the target layer, the layer being aligned to, while a measured overlay mark is formed in the current layer being aligned. The measured overlay mark, when used for measurement, is formed in photoresist, and is also sometimes referred to as a resist-defined target mark. This discussion will use the term "measured overlay mark," however, to refer both to the mark as formed in photoresist and to the feature that is left in the underlying layer after the subsequent etch. FIG. 2a shows a typical target overlay mark, outer frame 10, and a typical measured overlay mark, inner frame 12. If alignment was perfect, as in FIG. 2a, inner frame 12 is precisely centered in outer frame 10, and dimensions H1 and W1 are the same as dimensions H2 and W2. If alignment was imperfect, as in FIG. 2b, inner frame 12 is not centered in outer frame 10, and H1 and H2, or W1 and W2, will be different.

Alignment marks and overlay marks are formed outside of the active device area of each die, typically in the scribe lines where the dice will ultimately be cut apart to separate them. The alignment marks and overlay marks of successive layers are formed in different spots so that, for example, alignment marks in successive layers don't interfere with each other. Generally every photomask is unique, so as long as each reference mark is in a unique known location on each photomask, the danger of confusing reference marks from different photomasks can be avoided.

A monolithic three dimensional memory array is described in Herner et al., U.S. patent application Ser. No. 10/326,470, "An Improved Method for Making High Density Nonvolatile Memory," filed Dec. 19, 2002, since abandoned, hereinafter the '470 application and hereby incorporated by reference. Related memories are described in Herner, U.S. patent application Ser. No. 10/955,549, "Nonvolatile Memory Cell Without a Dielectric Antifuse Having High- and Low-Impedance States," filed Sep. 29, 2004, hereinafter the '549 application; in Herner et al. U.S. patent application Ser. No. 10/954,577, "Junction Diode Comprising Varying Semiconductor Compositions," filed Sep. 29, 2004, hereinafter the '577 application; and in Hemer et al., U.S. patent application Ser. No. 11/015,824, "Nonvolatile Memory Cell Comprising a Reduced Height Vertical Diode," filed Dec. 17, 2004, hereinafter the '824 application, all hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Figure 3:
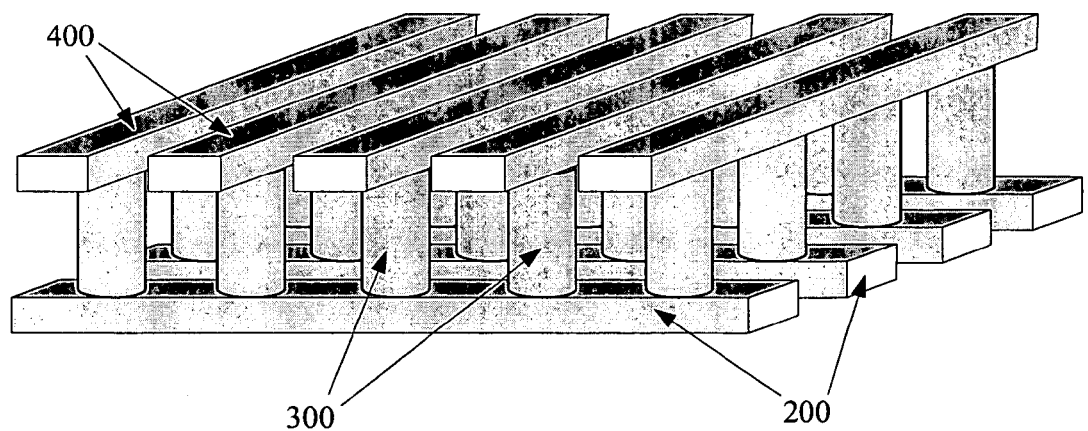
FIG. 3 is a perspective view of a single memory level in a monolithic three dimensional memory array.

Turning to FIG. 3, in each of the three dimensional memory arrays in the incorporated applications, a memory level comprises bottom conductors 200, pillars 300, and top conductors 400. Each memory cell includes a portion of one bottom conductor 200, one pillar 300, and a portion of one top conductor 400. The top and bottom conductors are conductive rails, preferably comprising tungsten. Each pillar 300 comprises a vertically oriented semiconductor diode, preferably a p-i-n diode comprising a bottom heavily doped region of a first conductivity type, a middle intrinsic or lightly doped region, and a top heavily doped region of a second conductivity type opposite the first conductivity type. In some embodiments the diode is formed in series with a dielectric rupture antifuse, for example a silicon dioxide layer.

The memory cell is formed in an initial high-resistance state, in which little or no current flows when a read voltage is applied. To program a cell, a relatively high programming voltage is applied between the top and bottom conductors. Application of this programming voltage permanently changes the cell, converting it to a low-resistance state, in which a reliably measurable current flows upon application of a read voltage. The difference in current flow on application of a read voltage distinguishes a programmed cell from an unprogrammed cell, and thus a memory "1" from a memory "0."

Vertically adjacent memory levels may share conductors; i.e. the top conductor of one memory level may serve as the bottom conductor of the next memory level. Alternatively, memory levels may not share conductors, and an interlevel dielectric may be formed separating them.

The memories of the '470, '549, '577, and '824 applications include multiple memory levels like the memory level of FIG. 3, each level stacked atop the previous level. Identical structures are formed in each memory level. It is possible to reuse the same photomask in formation of the same structure in each memory level. For example, the photomask used to pattern pillars 300 in the first memory level can be reused to form the pillars of each subsequent memory level.

A difficulty arises when reusing photomasks on the same wafer, however. When a photomask is used the second time, exactly the same reference marks are formed, in almost exactly the same locations, as in prior use of the photomask. The earlier and the present reference mark may interfere with each other.

Figure 4A:
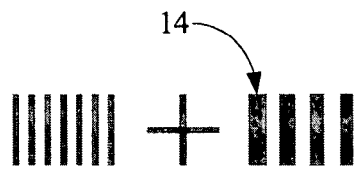
FIG. 4a is a plan view of the first occurrence of an alignment mark.
Figure 5A:
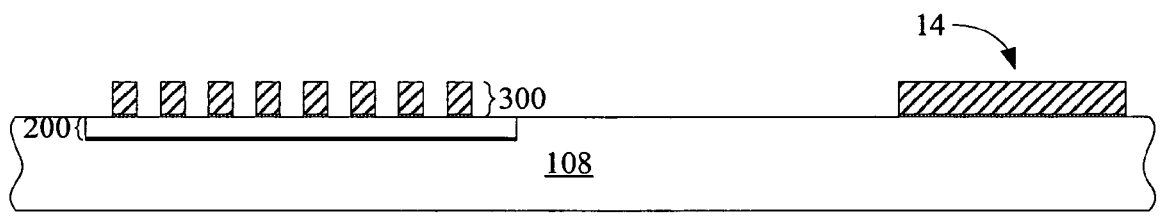
FIG. 5a is a cross-sectional view of a portion of a first memory level and an alignment mark formed with it.

For example, FIG. 4a shows an alignment mark 14 patterned in the same layer as pillars 300 during the first use of the pillar photomask, which will be called photomask BC0 (not shown), in formation of the first memory level. To form this layer, a polycrystalline silicon (polycrystalline silicon will be referred to this in discussion as polysilicon) stack is deposited, then patterned and etched to form pillars 300. Alignment mark 14 is formed during the same patterning step, and thus is also formed of polysilicon. A thin barrier layer, for example of titanium nitride, may separate this polysilicon stack from underlying tungsten, and may be patterned and etched in the same step. FIG. 5a shows a cross-sectional view of alignment mark 14, which is formed on planarized dielectric 108 along with pillars 300. Note that for ease of depiction this cross-section is intentionally not to scale. The dimensions of alignment mark 14 typically exceed the width of pillars 300 by a greater amount than can practically be depicted in FIG. 5a.

Figure 5B:
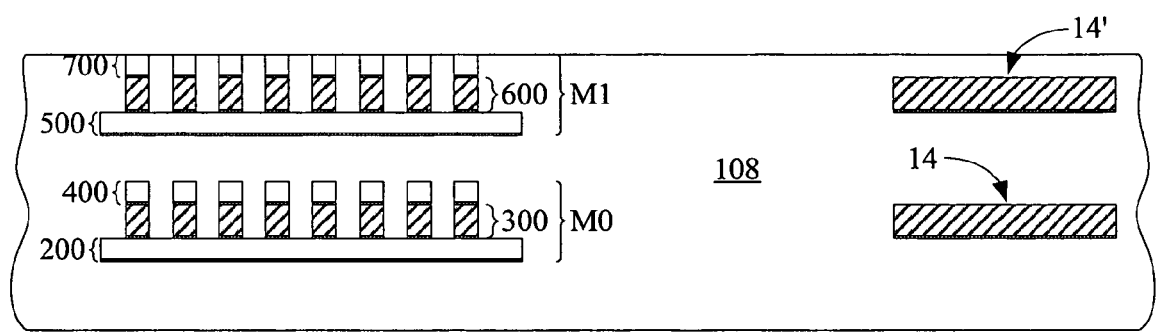
FIG. 5b is a cross-sectional view depicting a later stage of fabrication in which a second memory level and a second alignment mark has been formed.

Fabrication continues, as shown in FIG. 5b: Formation of top conductors 400 completes this first memory level M0, more dielectric 108 is deposited, and bottom conductors 500 of the next memory level M1 are formed. A thin barrier layer of titanium nitride and a polysilicon stack are deposited, and the photomask BC0 used to form pillars 300 is used again to form pillars 600 of memory level M1. As shown in FIG. 5b, alignment mark 14' is created, substantially directly above alignment mark 14 of memory level M0. (In this discussion, for one structure or feature to be "substantially directly above" another means that, while one is above the other, it need not be exactly above the other; there may be some misalignment.) Formation of top conductors 700 completes memory level M1.

Figure 4B:
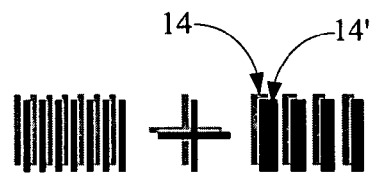
FIG. 4b is a plan view of the first occurrence of an alignment mark and the second occurrence of the same alignment mark immediately above it.

As shown in FIG. 4b, when alignment mark 14' of memory level M1 and alignment mark 14 of memory level M0 are viewed from above, the earlier alignment mark 14 may be visible, making it difficult for the stepper to locate the current alignment mark 14' and causing misalignment.

Figure 4C:
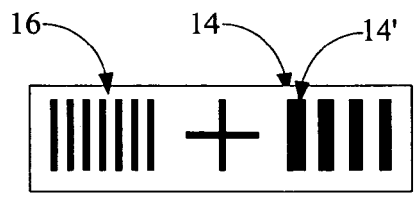
FIG. 4c is a plan view of the first and second occurrence of the same alignment mark in nearly the same location with a blocking structure between them, obscuring the first occurrence of the alignment mark.
Figure 5C:
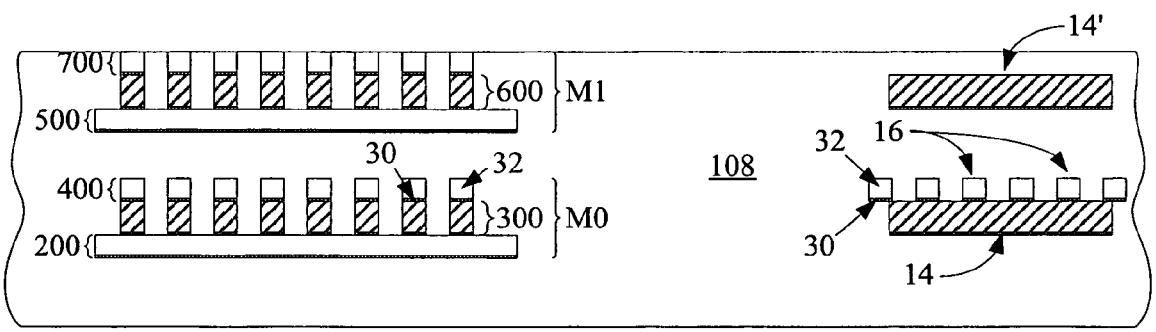
FIG. 5c is a cross-sectional view showing the same stage of fabrication as in FIG. 5b, with the addition of a blocking structure between the two alignment marks.

To prevent this problem, using the methods of the present invention, a blocking structure is formed at an intervening height between the current and previous instances of a reference mark (either an alignment mark or an overlay mark), serving to obscure the previous instance of the mark, so that no interference occurs between them. In FIG. 5c, a blocking structure 16 has been added, patterned at the same time and of the same material as top conductors 400 of memory level M0. This blocking structure 16 is a plurality of substantially parallel lines. The width and spacing of the lines that make up blocking structure 16 are sufficiently small that they cannot be distinguished by the stepper, and will behave as a solid structure, effectively obscuring first alignment mark 14 when viewed from above, as shown in FIG. 4c. (For this reason blocking structure 16 is shown in FIG. 4c as a solid pad, as it will appear to the stepper, even though it is actually a plurality of fine lines.)

To summarize, what has been described is a method to allow reuse of a first photomask in a monolithically formed stacked vertical structure, the method comprising: using the first photomask to form a first reference mark in a first layer; forming a blocking structure above the first reference mark, wherein the blocking structure serves to obscure the first reference mark when viewed from above; using the first photomask to form a second reference mark in a second layer, the second layer above the first layer and above the blocking structure. The blocking structure can be formed of an opaque material, as described, or as will be seen later, of a semi-opaque material, such as polysilicon. As described, the blocking structure may comprise a series of patterned shapes.

The problem could have been avoided by using different photomasks to pattern pillars 300 and pillars 600. These photomasks would be identical in every respect except the placement of the alignment mark. The alignment mark on the second photomask could be placed at a different location, where it would not interfere with the alignment mark created by the first photomask. Photomasks are very expensive, however, making this an unattractive option.

The measured overlay mark, which is formed in photoresist, is on the top layer and is always unobscured. Sometimes, during overlay mark measurement, the target overlay mark is is covered solely by transparent material. Silicon dioxide, the dielectric material most commonly used in integrated circuit fabrication, is transparent, and photoresist is nearly transparent. In this case the overlay marks can be located visually. In other cases, however, the reference mark, either the target overlay mark or the alignment mark is covered by one or more layers when the reference mark is to be located, and is not visible.

Figure 6:
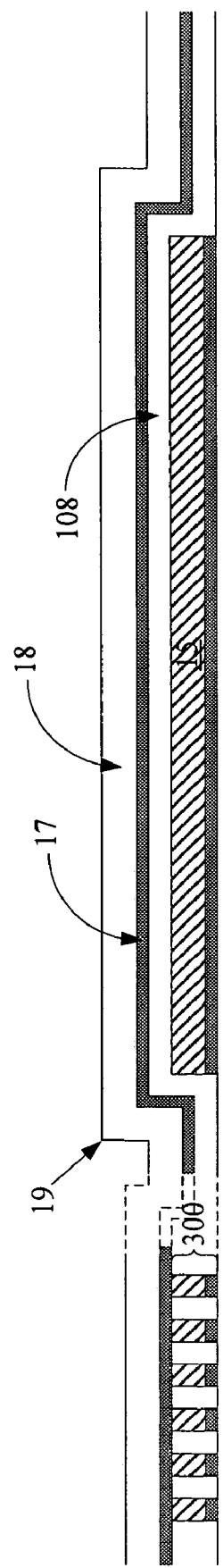
FIG. 6 is a cross-sectional view indicating transfer of topography through deposited layers.

Often, though, the reference marks can be located using other methods. Reference marks are typically very large and widely spaced compared to the actual patterned features making up the device. FIG. 6 shows a small portion of alignment mark 15, formed, for example, in a polysilicon stack formed at the same time as pillars 300. Dielectric 108 fills gaps between pillars 300 and is deposited on alignment mark 15. This depiction of an alignment is closer to scale than those shown previously (though still not to scale); alignment marks are very wide relative to patterned features formed in the device area. Suppose that next a thin adhesion layer 17 of titanium nitride, for example about 200 angstroms thick, and a layer of tungsten 18, for example about 1500 angstroms thick, are deposited. Conductors are to be patterned and etched in layers 17 and 18. It will be seen that within the array area, layers 17 and 18 have been deposited on a nearly planar surface, and no topography is visible at the surface of layer 18. In the area of alignment mark 15, however, the topography of alignment mark 15 is transferred through layers 17 and 18 and edges 19 are readily detectable at the surface of layer 18. Alignment mark 15 can be located by detecting this transferred topography even though it is covered by opaque layers 17 and 18.

If a blocking structure is to be formed later to mask alignment mark 15, it must render this mark undetectable either optically, or by transferred topography, or both. Thus when this discussion describes a blocking structure as "obscuring" an earlier-formed reference mark, it means that the blocking structure renders that mark undetectable either by visible means or by transferred topography or both.

As an alternative to locating a reference mark by way of transferred topography, if a reference mark is not visible optically, it is also known to perform an open frame etch. Such an etch step etches the obscuring layers in the area of the reference mark only and not in the active device area (e.g. layers 17 and 18 in FIG. 6.) This technique calls for an additional photomask and a pattern and etch step, but the dimensions and placement of this photomask need not be determined with the same precision as a patterning step that forms features within the active device area. A photomask for performing an open frame etch, then, is cheaper than the usual photomask.

The entire structure to be formed, including all process steps, must be considered to determine the appropriate placement and form of blocking structures to prevent interference between recurring reference marks when reusing photomasks. A detailed example will be provided of fabrication of a monolithic three dimensional memory array having four stacked memory levels in which the methods of the present invention are used to allow reuse of photomasks. For completeness, this example will include many details, including materials, dimensions, conditions, and process steps. It will be understood by those skilled in the art that many of these details can be modified, augmented, or omitted while the results still fall within the scope of the invention. This example is provided as an illustration only.

The monolithic three dimensional memory array to be described is similar to that described in the '470, '549, '577, and '824 applications. For simplicity and to avoid obscuring the invention, not all of the detail provided in those applications is included. It will be understood, however, that no teaching of any of the '470, '549, '577, or '824 applications is intended to be excluded.

EXAMPLE

Figure 7:
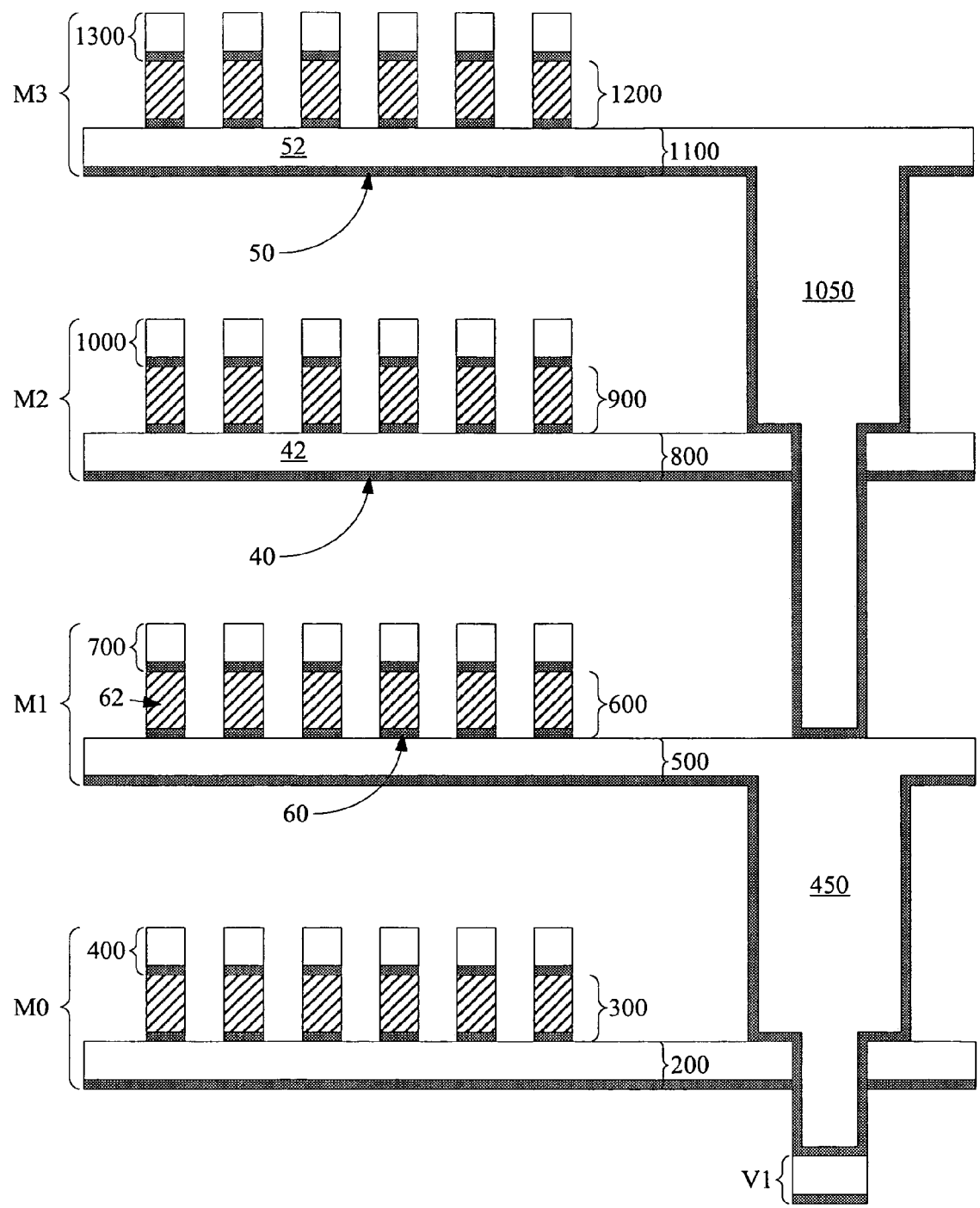
FIG. 7 is a cross-sectional view of a monolithic three dimensional memory array having four memory levels.

FIG. 7 is a cross-sectional view of a monolithic three dimensional memory array having four stacked memory levels. It will be understood that such a memory array could have more memory levels or fewer.

Fabrication begins with a substrate, preferably a monocrystalline silicon wafer. Before formation of memory levels begins, routing layers are formed above the substrate, including routing layer V1. (For simplicity, not all routing layers are shown.) A conductor photomask, Y0, is used to form bottom conductors 200 of memory level M0. A pillar photomask, BC0, is used to form pillars 300 of memory level M0, and another conductor photomask, X1, is used to form top conductors 400, completing memory level M0. Each of these photomasks is unique. (Names like Y0, BC0, and X1 are used to refer to unique photomasks for clarity, and these names will appear in charts in FIGS. 8 and 9. FIG. 7, however, shows the structures formed, not the photomasks used to form them; thus the photomasks are not pictured in this figure.)

Bottom conductors 200, pillars 300, and top conductors 400 together form memory cells, and alignment between them is critical. All of the conductors V1, 200, and 400 and the pillars 300 are formed by subtractive methods, in which a conductive material is deposited, then patterned and etched to leave conductive features. Gaps between the conductive features are filled with dielectric (not shown.)

Figure 8:
FIG. 8 is a chart indicating alignment of photomasks, and location of blocking structures according to the present invention, during the formation of the structure of FIG. 7.

FIG. 8 is a chart illustrating alignment. For each photomask, a symbol (⊕) indicates the layer currently being aligned, while an alignment mark symbol indicates the layer of the alignment mark to which the current photomask is being aligned. It will be seen that the V1 photomask is aligned to an alignment mark in the R1 routing layer; that the R2 photomask is aligned to an alignment mark located in the V1 routing layer, and the Y0 photomask is also aligned to an alignment mark located in the V1 routing layer.

Similarly, each of pillar photomask BC0 and top conductor photomask X1 is aligned to an alignment mark formed in the immediate previous layer.

Figure 9:
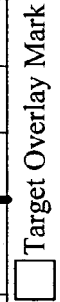
FIG. 9 is a chart indicating location of measured and target overlay marks, and location of blocking structures according to the present invention, during the formation of the structure of FIG. 7.

FIG. 9 is a chart illustrating placement of overlay marks. In this case the target overlay mark, placed on the target layer (the layer being aligned to), is an outer frame, while the measured overlay mark, formed in the aligning layer, is an inner frame which is ideally centered within the outer frame. It will be seen (column 4) that achieved alignment is measured between the inner frame of pillars 300 and the outer frame of bottom conductors 200. Similarly (see column 5), the inner frame of top conductors 400 is measured against the outer frame of the immediate previous layer, pillars 300.

Returning to FIG. 7, after completion of memory level M0, an interlevel dielectric is formed and planarized. The next etch etches a void in the interlevel dielectric material. Vertical interconnect 450 will be formed in this void. Vertical interconnect 450, also known as a zia, provides electrical connection between memory levels and between underlying support circuitry. Zia 450 connects to routing layer V1. Thus its alignment to V1, rather than to top conductors 400, is most critical. The photomask Z1 used to etch the void in which zia 450 is formed thus is most appropriately aligned to routing layer V1, not to the previous layer.

It will be seen, referring to FIG. 8 (column 6), that photomask Z1 is aligned to the alignment mark formed in routing layer V1. Similarly, referring to FIG. 9, the inner frame (the measured overlay mark) patterned in the dielectric layer in which zia 450 is formed is intended to nest within the outer frame (the target overlay mark) of routing layer V1 (column 6.)

Formation of memory level M1 begins with pattern and etch of bottom conductors 500. Due to small differences in how connection is made from zias to bottom conductors 500 of memory level M1 and bottom conductors 200 of memory level M0, the photomasks used to pattern bottom conductors 500 and bottom conductors 200 are not identical. A unique conductor photomask Y2 is used to pattern conductors 500. (Recall that photomask Y0 was used to pattern conductors 200.) Thus no interference takes place between the reference marks of these two layers.

After deposition of a titanium nitride barrier layer and a semiconductor layer stack, pillars 600 will be patterned. Pillar photomask BC0, which was used to pattern pillars 300 in memory level M0, is reused. The alignment mark, target overlay mark, and measured overlay mark formed by photomask BC0 during patterning of pillars 600 are formed directly above the same marks formed during patterning of pillars 300, on the first use of photomask BC0.

The first problem arises on the first attempt to use a repeated overlay mark. Referring to FIG. 7, a titanium nitride barrier layer and a polysilicon stack that will be patterned to form pillars 600 are deposited. A layer of photoresist is deposited on the polysilicon stack, and photomask BC0 is used to expose the photoresist. Referring to FIG. 9 (column 8), after developing, a measured overlay mark in the shape of an inner frame is formed in photoresist. To confirm proper placement of photomask BC0, the location of this inner frame will be measured relative to a corresponding target overlay mark, an outer frame patterned with bottom conductors 500 which was formed for this purpose.

Turning to FIG. 10a, it will be seen that the inner frame measured overlay mark 26' patterned in photoresist 20 is formed substantially directly above the inner frame measured overlay mark 26 patterned with pillars 300. If no blocking structure is formed vertically interposed between measured overlay mark 26 and measured overlay mark 26', measured overlay mark 26 may interfere with measured overlay mark 26'. Interference may be by way of transferred topography, which for simplicity is not depicted here.

Figure 10B:
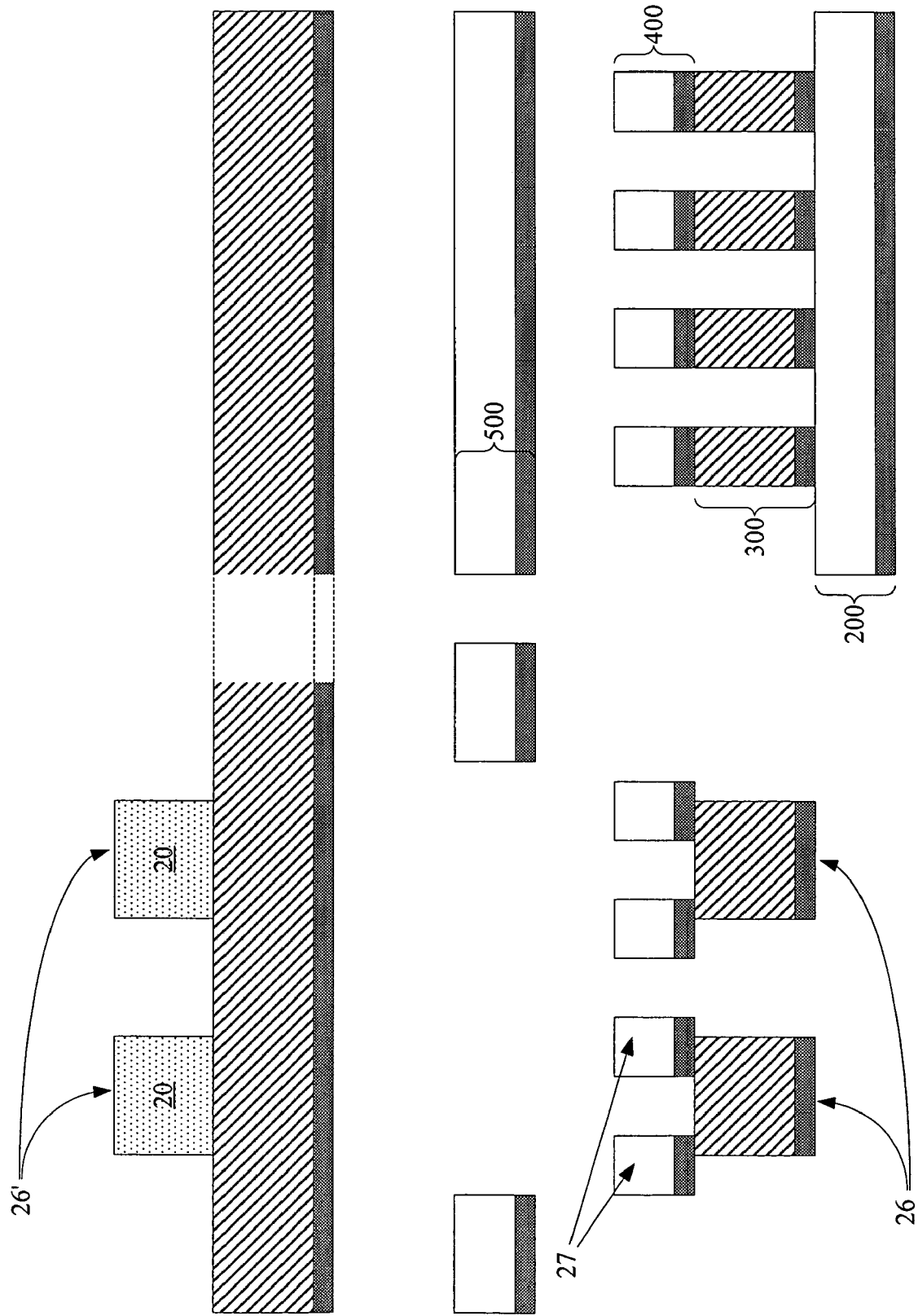
FIG. 10b is a cross-sectional view of the same structure with a blocking structure added.

Referring to FIG. 9, in column 8 it will be seen that the measured overlay mark (inner frame) formed in photoresist during patterning of pillars 600 is to be measured relative to the target overlay mark (outer frame) patterned with bottom conductors 500. Interference with the measured overlay mark (inner frame) patterned with pillars 300 (of memory level M0) is prevented by formation of a blocking structure that was formed with top conductors 400 of memory level M0. As shown in FIG. 10b, the blocking structure 27 is preferably a plurality of substantially parallel, substantially coplanar lines in an area large enough to obscure the measured overlay mark 26 formed by photomask BC0 during patterning of pillars 300, as shown in FIG. 10b.

What is being formed is a monolithic three dimensional semiconductor device structure comprising a first layer including a first occurrence of a first reference mark at a first location; a second layer including a second occurrence of the first reference mark at a second location, wherein the second location is substantially directly above the first location; and an intermediate layer between the first layer and the second layer, the intermediate layer including a blocking structure, wherein the blocking structure is vertically interposed between the first occurrence of the first reference mark and the second occurrence of the first reference mark.

After completion of pillars 600, another problem may occur with an attempt to use a repeated alignment mark. Referring to FIG. 7, a titanium nitride layer and a tungsten layer are deposited on polysilicon pillars 600, covering the polysilicon alignment mark formed at the same level. In order to pattern top conductors 700 of memory level M1 (see FIG. 8, column 9), a photomask X3 which will be used to pattern top conductors 700 must be placed relative to the alignment mark formed by photomask BC0.

This alignment mark, however, is directly above the first alignment mark created by the first use of photomask BC0 to form pillars 300 of memory level M0. In this example, the current alignment mark formed with pillars 600 is covered by tungsten, which is opaque, so the alignment mark will be located by locating topography transferred through the titanium nitride and tungsten layers. If no intervening blocking structure is formed, topography transferred from the alignment mark patterned with pillars 300 may interfere with the transferred topography from the latest alignment mark patterned with pillars 600.

Referring to FIG. 5b, for example, alignment mark 14 patterned with pillars 300 may interfere with alignment mark 14' patterned with pillars 600.

Referring to column 9 of FIG. 8, then, it will be seen that this interference is prevented by formation of a blocking structure that was formed with top conductors 400 of memory level M0. As shown in FIG. 5c, the blocking structure 16 is preferably a plurality of substantially parallel, substantially coplanar lines in an area large enough to obscure the alignment mark formed by photomask BC0 during patterning of pillars 300.

A plurality of lines is used instead of a solid pad for several reasons. This blocking structure is formed of tungsten. Large tungsten structures tend to peel, while a series of tungsten lines will not.

In addition, structures formed outside of the active device area, including alignment marks, overlay marks, and blocking structures, are exposed to the same processes as structures within the active device area. Referring to FIG. 5c, blocking structure 16 is formed at the same time and of the same material as top conductors 400. Top conductors 400 are formed by depositing between about 20 angstroms and about 1000 angstroms, preferably about 200 angstroms, of titanium nitride 30 on a surface that has been planarized, for example by chemical-mechanical planarization (CMP). Next a layer 32 of about 1500 angstroms of tungsten is deposited. Within the active device area, these layers are patterned and etched to form top conductors 400. A dielectric material 108 is deposited over and between conductors 400, filling gaps between them and covering them, forming an interlevel dielectric. A planarization step, for example by CMP, follows, forming a substantially planar surface for the fabrication of memory level M1. The deposition of the dielectric and the duration of the CMP step are optimized to form a planar surface within the active device area. If the lines that make up blocking pad 16 have about the same dimensions as conductors 400, it can be expected that deposition of dielectric and CMP will have the same affect in this area, and will also produce a substantially planar surface. In this case, though, the purpose of the substantially planar surface is to effectively obscure first alignment mark 14, preventing its topography from transferring to subsequent layers, and preventing any interference with alignment mark 14'.

Fabrication continues. Referring to FIGS. 7 and 9, to pattern top conductors 700, photomask X3 is aligned to the alignment mark formed with pillars 600. Photoresist on the titanium nitride and tungsten layers that will form top conductors 700 is exposed and developed, forming a measured overlay mark in the shape of an inner frame. As shown in column 9, this inner frame measured overlay mark should be centered within an outer frame target overlay mark that was patterned during the second use of the BC0 photomask, along with pillars 600 of memory level M1. A first instance of this outer frame target overlay mark was formed during the first use of the BC0 photomask, along with pillars 300 of memory level M0. To prevent interference of the target overlay mark patterned with pillars 600 with the previously formed instance of the same target overlay mark, a blocking structure (preferably a plurality of substantially parallel, substantially coplanar lines in an area large enough to obscure the target overlay mark formed by photomask BC0 during patterning of pillars 300 of memory level M0) is patterned with top conductors 400 of memory level M0, as shown in FIG. 9.

To summarize, what is described is a method for forming a monolithic three dimensional memory array, the method comprising: a) forming a first memory level, the step of forming the first memory level comprising using a first photomask to form a first layer at a first height, the first layer comprising a first reference mark; b) forming a second layer at a second height above the first height, the second layer comprising a blocking structure; and c) forming a second memory level, the step of forming the second memory level comprising using the first photomask to form a third layer at a third height above the second height, the third layer comprising a second reference mark, wherein the blocking structure is vertically interposed between the first reference mark and the second reference mark.

Referring to FIG. 7, photomask X3 is used to pattern top conductors 700, completing memory level M1. An interlevel dielectric is formed and planarized, and fabrication of memory level M2 begins. A titanium nitride adhesion layer 40 and a tungsten layer 42 are deposited on the planarized dielectric. Photoresist is deposited on the tungsten layer, and will be patterned using photomask Y0 to form bottom conductors 800 of memory level M2. A measured overlay mark is formed in photoresist. Referring to FIGS. 7 and 9 (column 10), to check the accuracy of the placement of photomask Y0, the measured overlay mark formed in photoresist is measured relative to a target overlay mark that was patterned with top conductors 700 of memory level M1.

Recall, however, that this is the second use of photomask Y0. Photomask Y0 was used to pattern bottom conductors 200 of memory level M1. Thus the measured overlay mark, in the shape of an inner frame, is formed in photoresist substantially directly above the same measured overlay mark patterned at the level of bottom conductors 200, formed during the first use of photomask Y0. The previously formed measured overlay mark may interfere with the present measured overlay mark.

To prevent this interference, a blocking structure was patterned during patterning of bottom conductors 500. The blocking structure is preferably a plurality of substantially parallel, substantially coplanar lines in an area large enough to obscure the measured overlay mark formed by photomask Y0 during patterning of bottom conductors 200, as shown in FIG. 9.

Similarly, referring to FIGS. 7 and 8 (column 11), when photomask BC0 (on its third use, to pattern pillars 900) is being placed relative to the alignment mark created by the Y0 photomask during patterning of bottom conductors 800 of memory level M2, this alignment mark may interfere with the same alignment mark created during the first use of the Y0 photomask, during patterning of bottom conductors 200 of memory level M0. To prevent this interference, preferably a blocking structure is formed vertically interposed between the alignment mark created during patterning of bottom conductors 200 of memory level M0 and the identical alignment mark created during patterning of bottom conductors 800 of memory level M2. As shown in FIG. 8, such a blocking structure can be patterned, for example, during patterning of top conductors 400 of memory level M0. This blocking structure is preferably a plurality of substantially parallel, substantially coplanar lines in an area large enough to obscure the measured overlay mark formed by photomask Y0 during patterning of bottom conductors 200.

It was described earlier how the second use of photomask BC0 during formation of pillars 600 of memory level M1 created an alignment mark, target overlay mark, and measured overlay mark substantially above the alignment mark, target overlay mark, and measured overlay mark created during the first use of photomask BC0 during formation of pillars 300 of memory level M0, and that blocking structures were created at intervening levels to prevent interference between the first and second instance of each reference mark. Photomask BC0 is used a third time to pattern pillars 900 of memory level M2, and, predictably, the same problem of interference arises again.

Referring to FIGS. 7 and 9 (column 11), interference between the measured overlay mark (inner frame) patterned with pillars 900 of memory level M2 and the prior measured overlay mark patterned with pillars 600 of memory level M1 (both patterned with photomask BC0) is prevented by formation of a blocking structure vertically interposed between them. This blocking structure, as shown in FIG. 9, is preferably patterned with top conductors 700 of memory level M1. This blocking structure is preferably a plurality of substantially parallel, substantially coplanar lines in an area large enough to obscure the measured overlay mark formed by photomask BC0 during patterning of pillars 600. This blocking structure also serves to obscure the measured overlay mark patterned with pillars 300 on the first use of photomask BC0, and the target overlay mark (outer frame) patterned with bottom conductors 200 on the first use of photomask Y0.)

Referring to FIGS. 7 and 8 (column 12), interference between the alignment mark patterned with pillars 900 of memory level M2 and the prior alignment mark patterned with pillars 600 of memory level M1 (both patterned with photomask BC0) is prevented by formation of a blocking structure vertically interposed between them, also preferably patterned with top conductors 700 of memory level M1. This blocking structure is preferably a plurality of substantially parallel, substantially coplanar lines in an area large enough to obscure the alignment mark formed by photomask BC0 during patterning of pillars 600.

Referring to FIGS. 7 and 9 (column 12), interference between the target overlay mark (outer frame) patterned with pillars 900 of memory level M2 and the prior target overlay mark patterned with pillars 600 of memory level M1 (both patterned with photomask BC0) is prevented by formation of a blocking structure vertically interposed between them. This blocking structure, as shown in FIG. 9, is also preferably patterned with top conductors 700 of memory level M1. This blocking structure is preferably a plurality of substantially parallel, substantially coplanar lines in an area large enough to obscure the target overlay mark formed by photomask BC0 during patterning of pillars 600.

Referring to FIG. 7, etch of top conductors 1000 completes memory level M2. Dielectric material is deposited to form an interlevel dielectric, and the top of the dielectric is planarized to produce a planar surface. The fourth and final memory level M3 will be formed on this planar surface, beginning with bottom conductors 1100. Before deposition of the titanium nitride and tungsten layers that will form bottom conductors 1100, however, a dielectric etch is performed. This is a very deep dielectric etch that will form the void in which zia 1050 will be formed. Zia 1050 will provide electrical connection between bottom conductors 1100 of memory level M3 and the top of zia 450. This layer is patterned using photomask Z1. It will be seen from FIG. 8 and FIG. 9 that this is the second use of photomask Z1. Photomask Z1 was also used in formation of zia 450, which connects bottom conductors 500 of memory level M1 to routing layer V2.

It will be recalled that, while most layers are best aligned to the immediate previous layer, zia 450 made contact to routing layer V2, and thus was aligned to it (as shown in column 6 of FIG. 8), rather than to the layer patterned immediately before it, top conductor 400. As shown in column 13, the same applies to zia 1050; rather than being aligned with top conductor 1000 of memory level M2, this etch is aligned to an earlier layer, preferably to top conductor 700. (It is ideally aligned to bottom conductor 500, to which it is to make contact, but with so many intervening layers this may be impractical. Top conductors 700 were precisely aligned with pillars 600, however, and pillars 600 were precisely aligned with bottom conductors 500; thus alignment to top conductors 700 generally proves to be sufficient.)

Referring to FIGS. 7 and 9 (column 13), the measured overlay mark (inner frame) patterned during the first use of photomask Z1, when etching the void in which via 450 was deposited, will interfere with the present measured overlay mark, formed in photoresist preceding the dielectric etch to form zia 1050. The first measured overlay mark, the inner frame formed during the first dielectric etch that opened the void in which zia 450 was formed, in most embodiments is formed of silicon dioxide, which is transparent. Thus it might be expected that the first measured overlay mark will not be visible, and interference will not occur in this instance.

In most of the pattern and etch steps described so far, the layer to be etched is covered with a blanket of photoresist. The photomask defines features and reference marks. After the exposure and developing process, positive photoresist features remain, including, for example, pillars or rail-shaped conductors and reference marks such as, for example, alignment and inner and outer frame overlay marks.

The zia etch is preferably performed somewhat differently, however. In this case the entire surface is covered with photoresist and only the voids in which zias are to be formed are removed during the developing process. Overlay marks are formed negatively as well. For example, after the exposure and developing steps, the measured overlay mark, preferably an inner frame, is formed as a frame-shaped void in the photoresist, not as a positive feature. When the etch is performed to create the zia voids, the inner frame measured overlay mark creates a void in the dielectric in the shape of the inner frame.

Figure 11A:
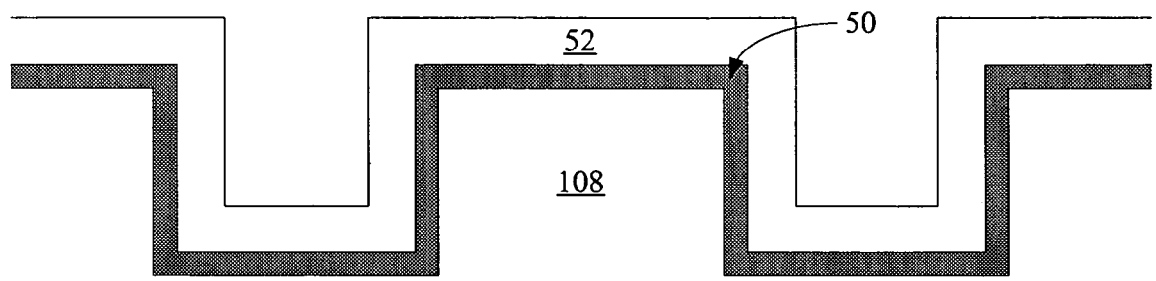
FIGS. 11a and 11b are cross-sectional views of a measured overlay mark formed of dielectric and covered by opaque layers before and after etch of the opaque layers.
Figure 11B:
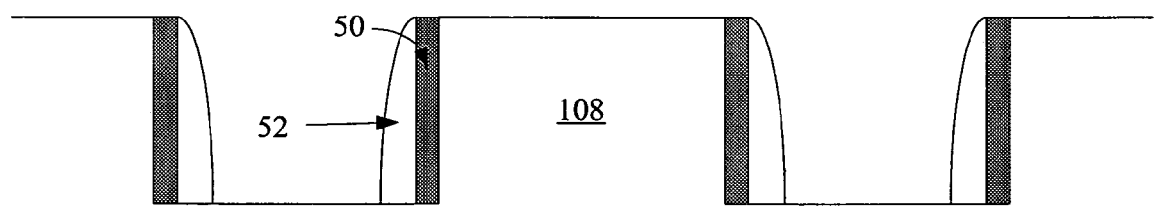

Note also that this dielectric etch is very deep. FIG. 11a shows, cross-section the measured overlay mark formed of dielectric 108, which is a frame-shaped trench having a relatively high aspect ratio. After this etch, titanium nitride layer 50 and tungsten layer 52, which will fill the void, forming zia 450 and bottom conductors 500 (see FIG. 7), are deposited. The pattern and etch step to etch bottom conductors 500 will not be sufficient to clear titanium nitride 22 and tungsten 24 from within the very deep measured overlay mark formed during the same etch; thus some tungsten and titanium nitride will remain, as shown in FIG. 11b, which will be visible when viewed from above, and may cause optical interference with the second instance of this same measured overlay mark formed when a void is etched to form via 1050.

Referring to FIGS. 7 and 9 (column 13), a blocking structure thus is required to prevent interference between the measured overlay mark (the inner frame) patterned in dielectric during the first use of photomask Z1 (when etching the void for zia 450) and the measured overlay mark patterned in photoresist during the second use of photomask Z1 (before etching the void for zia 1050.) Placement of this blocking structure presents challenges, however. As illustrated in FIGS. 11a and 11b, the great depth of the etch that forms the first instance of the measured overlay mark formed by photomask Z1 makes the formation of a blocking structure patterned in the layer immediately following (with bottom conductors 500) impractical, as these layers will be deposited over very large topography.

After formation of bottom conductors 500, dielectric fill will be deposited, reducing topography. A blocking structure can practically be formed with the next layer, then, which is the polysilicon stack that will be patterned into pillars 600. It will be recalled that all of the pillars are patterned with photomask BC0, which is reused to pattern pillars 300, 600, 900, and (eventually) 1200. This blocking structure will thus comprise a polysilicon stack 60 and a titanium nitride barrier layer 62 (in FIG. 7.)

The size and placement of this blocking structure is crucial. The blocking structure is intended to be patterned with pillars 600. Referring to FIG. 9, because the same photomask BC0 is reused, however, another instance of the same blocking structure will unavoidably be formed with pillars 900, and will also intervene between the current inner frame measured overlay mark and the previous inner frame measured overlay mark, formed during the etch to form zia 450. As will be seen from FIG. 9, column 13, the instance of the blocking structure patterned with pillars 900 is vertically disposed between the current measured overlay mark and the outer frame target overlay mark (patterned with top conductors 700) that it is intended to be measured against. If the blocking structure is too large, it may obscure all or part of the target overlay mark, which much be detectable for successful overlay measurement. Thus this polysilicon blocking structure must be big enough to obscure the inner frame, but small enough to avoid obscuring the outer frame.

In this case, a first overlay mark and a second overlay mark have been formed, the second above the first, with a blocking structure vertically interposed between them. A third overlay mark is below the blocking structure, wherein the second overlay mark is adapted to fit inside the area of the third overlay mark when viewed from above, and wherein the blocking structure does not obscure the third overlay mark.

Larger polysilicon structure are not so prone to peeling as large tungsten structures, however, so this polysilicon blocking structure can be a solid pad rather than a series of parallel lines.

As shown in FIG. 8, column 14, the first occurrence of the alignment mark formed by the first use of photomask Z1 is preferably blocked by the use of a blocking structure which is a polysilicon pad; an instance of this blocking structure is formed with each use of photomask BC0, with pillars 300, 600, 900, and, eventually, 1200.

Turning back to FIG. 9, column 14, the first instance of the target overlay mark (outer frame) formed by photomask Z1 (formed during the etch to form zia 450) can be blocked by use of a blocking structure formed at an intervening layer, for example a blocking structure formed with top conductors 700 of memory level M1.

Turning to FIG. 7, after deposition of titanium nitride layer 50 and tungsten layer 52, filling zia 1050, the Y2 photomask is used to pattern bottom conductors 1100 of memory level M3. This is the second use of the Y2 photomask. As seen in FIGS. 8 (column 15) and 9 (column 14), blocking structures are preferably formed with top conductors 700 of memory level M1 to prevent interference with prior instances of the alignment mark and the measured overlay mark (inner frame) patterned in the first use of photomask Y2, while, as shown in column 15 of FIG. 9, a blocking structure patterned with bottom conductors 1000 of memory level M2 prevents interference with the prior instance of the target overlay mark (outer frame.) Each of these blocking structures is preferably a plurality of substantially parallel, substantially coplanar lines in an area large enough to obscure the previous instance of the same reference mark.

Referring to FIG. 7, after pattern and etch of bottom conductors 1100 of memory level M3, the formation of pillars 1200 is achieved by the fourth use of photomask BC0, creating fourth instances of the alignment mark and measured and target overlay marks. As shown in FIGS. 8 (column 16) and 9 (columns 15 and 16), in a preferred embodiment blocking structures are patterned with top conductors 1000 to block previous instances of all three of these reference marks. Each of these blocking structures is preferably a plurality of substantially parallel, substantially coplanar lines in an area large enough to obscure the previous instance of the same reference mark.

Fabrication continues with a final dielectric etch to form zias (not shown) connecting top conductors 1300 to lower memory levels, patterning of top metal (not shown) using photomask™, and formation of a pad using photomask PAD. This is the first use of each of these photomasks, so no interference with earlier reference marks takes place, and no further blocking structures need be formed.

Detailed methods of fabrication have been described herein, but any other methods that form the same structures can be used while the results fall within the scope of the invention. It will also be understood that the example provided is only one embodiment. Certain blocking structures could have been formed at different points in the structure. The blocking structures described herein were either a polysilicon pad or a plurality of parallel metal lines, but clearly a blocking structure could take many other forms, so long as it served to obscure a prior recurrence of a reference mark, by masking the mark optically, by preventing the transfer of detectable transferred topography, or by some other method.

Similarly, those skilled in the art will appreciate that the monolithic three dimensional memory array described herein is just one example of an integrated circuit in which photomasks are reused. A four-level memory comprising pillars and rail-shaped conductors was described. Other types of memories having layers or elements different from the ones described here, or non-memory structures, could use blocking structures according to the methods of the present invention to allow reuse of photomasks in formation of a complex integrated circuit.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method to allow reuse of a first photomask in a monolithically formed stacked vertical structure, the method comprising:
   using the first photomask to form a first reference mark in a first layer;
   forming a blocking structure above the first reference mark, wherein the blocking structure serves to obscure the first reference mark when viewed from above;
   reusing the first photomask to form a second reference mark in a second layer, the second layer above the first layer and above the blocking structure.

2. The method of claim 1 wherein the first reference mark is a first alignment mark.

3. The method of claim 1 wherein the blocking structure is a single patterned feature formed of an opaque or semi-opaque material.

4. The method of claim 3 wherein the opaque or semi-opaque material is a metal or polysilicon.

5. The method of claim 1 wherein the blocking structure comprises a series of patterned shapes.

6. The method of claim 5 wherein the series of patterned shapes comprises a series of parallel lines separated by gaps.

7. The method of claim 1 wherein the first reference mark is a first overlay mark.

8. The method of claim 7 wherein the first overlay mark is a first target overlay mark.

9. The method of claim 7 wherein the first overlay mark is a first measured overlay mark.

10. The method of claim 7 wherein the second reference mark is a second overlay mark, the method further comprising forming a third overlay mark below the blocking structure, wherein the second overlay mark is adapted to fit inside the area of the third overlay mark when viewed from above, and wherein the blocking structure does not obscure the third overlay mark.

11. The method of claim 10 wherein the first and second overlay marks are measured overlay marks and the third overlay mark is a target overlay mark.

12. The method of claim 10 wherein the first and second overlay marks are target overlay marks and the third overlay mark is a measured overlay mark.

13. The method of claim 1 wherein the monolithically stacked vertical structure is a monolithic three dimensional memory array.

14. The method of claim 1, wherein the blocking structure comprises a plurality of patterned features.

15. A method for avoiding interference between recurring reference marks when reusing photomasks in formation of a vertically stacked structure, the method comprising:
   using a first photomask to form a first reference mark at a first height above a substrate and at a first position;
   forming a blocking structure at a second height above the first height and at a second position, the second position substantially directly above the first position;
   reusing the first photomask to form a second reference mark at a third height above the second height and at a third position, the third position substantially directly above the second position,
   wherein, during the step of forming the second reference mark, the blocking structure serves to substantially render the first reference mark substantially undetectable when viewed from above.

16. The method of claim 15 wherein the first reference mark and the second reference mark are alignment marks.

17. The method of claim 15 wherein the first reference mark and the second reference mark are overlay marks.

18. The method of claim 17 wherein the first reference mark and the second reference mark are target overlay marks.

19. The method of claim 17 wherein the first reference mark and the second reference mark are measured overlay marks.

20. The method of claim 15 wherein the blocking structure is a single patterned feature.

21. The method of claim 15 wherein the blocking structure comprises a series of patterned features.

22. The method of claim 21 wherein the series of patterned features comprises a plurality of substantially parallel lines separated by gaps.

23. The method of claim 15 wherein the substrate comprises monocrystalline silicon.

24. The method of claim 15, wherein the blocking structure comprises a plurality of patterned features.

* * * * *